United States Patent [19]

Shaw

[11] Patent Number: 5,684,311
[45] Date of Patent: Nov. 4, 1997

[54] BASE CELL FOR BICMOS AND CMOS GATE ARRAYS

[75] Inventor: Ching-Hao Shaw, Plano, Tex.

[73] Assignee: Texas Instruments Incorporated, Dallas, Tex.

[21] Appl. No.: 651,137

[22] Filed: May 21, 1996

Related U.S. Application Data

[62] Division of Ser. No. 240,411, May 10, 1994, Pat. No. 5,591,995.

[51] Int. Cl.$^6$ .................................................. H01L 27/10
[52] U.S. Cl. .............................................. 257/206; 257/202
[58] Field of Search ............................... 257/202, 204, 257/205, 206, 207

[56] References Cited

U.S. PATENT DOCUMENTS 5,055,716  10/1991  El Gamel ........................... 307/446

*Primary Examiner*—Jerome Jackson
*Assistant Examiner*—Nathan K. Kelley
*Attorney, Agent, or Firm*—Jacqueline J. Garner; W. James Brady, III; Richard L. Donaldson

[57] ABSTRACT

A gate array base cell is disclosed which provides decreased input loading. The preferred base cell comprises two rows of CMOS sites. Each row comprises small CMOS sites CS and large CMOS sites CL. The transistor gates in the small CMOS site CS are narrower than the transistor gates in the large CMOS site CL. Preferably, the CS sites comprise transistor gates one half the size of transistor gates in the CL sites so that transistor the CS sites may be connected in parallel to form the electrical equivalent of transistor gates in the CL sites.

6 Claims, 14 Drawing Sheets

FIG. 2a  FIG. 2b

BASE CELL FOR BICMOS AND CMOS GATE ARRAYS

This is a division of application Ser. No. 08/240,411, filed May 10, 1994 now U.S. Pat. No. 5,591,995.

FIELD OF THE INVENTION

The invention relates generally to the field of semiconductor devices and more specifically to base cells for BiCMOS and CMOS gate arrays.

BACKGROUND OF THE INVENTION

Gate arrays comprise many identical base cells arranged in rows and columns. Metallization patterns are fabricated on the base cells of a gate array to create an application specific integrated circuit (ASIC). Gate arrays are thus configurable to implement various logic circuits based on customer specifications.

Conventional base cells for gate arrays of application specific integrated circuit (ASIC) chips are generally tiled laterally. FIG. 1 illustrates a plan view of a representative portion of the tiling of prior art bipolar/complementary metal oxide semiconductor (BiCMOS) base cells. Complementary metal oxide semiconductor (CMOS) sites, which primarily include CMOS circuitry, are designated by the letter C. Bipolar sites, which primarily include bipolar drive circuitry, are designated by the letter B. The connectivity between sites is generally lateral, as indicated by connection symbol 2.

Note that although the lateral connectivity between abutting CMOS sites generally present no problems, the lateral connection of CMOS sites across a bipolar site effectively precludes the use of the bipolar site interposed therebetween. The interconnect metallization between such CMOS sites will not allow use of the interposed bipolar site because there is not enough area left to make physical connection to the bipolar device. This type of preclusion of bipolar sites can lead to significant under utilization of gate array chip real estate. An improved base cell tiling is desired which includes improved bipolar site utilization. Further, high input capacitances due to architectural constraints and unused cell site areas lead to less than optimal gate array operation speed.

SUMMARY OF THE INVENTION

An improved gate array base cell is provided which allows decreased input loading in comparison with conventional gate array base cells.

In one embodiment of the invention, a BiCMOS gate array base cell is disclosed which includes at least one bipolar site disposed between rows of CMOS sites and connectable to the CMOS sites above and below the at least one bipolar site.

Another embodiment of the invention provides a gate array base cell wherein transistor gates in one CMOS site are narrower than the transistor gates in an adjacent site. This embodiment can be implemented either as a BiCMOS or CMOS gate array base cell and/or may be implemented so as to have low input gate capacitance. In a further embodiment, the narrower transistor gates may be one half the size of the wider transistor gates in the adjacent site so that the narrow transistor gates may be connected in parallel to form the electrical equivalent of the wider transistor gates.

An advantage of the invention is providing a gate array that allows higher site utilization than prior art devices.

A further advantage of the invention is providing a gate array that has CMOS circuitry that can be configured to provide low input gate capacitance or higher drive ability.

These and other advantages will be apparent to those of ordinary skill in the art having reference to the specification in conjunction with the drawings.

BRIEF DESCRIPTION OF THE DRAWINGS

FIG. 2a illustrates a plan view of a gate array base cell which allows high bipolar site utilization (HBU) according to the invention.

FIG. 2b illustrates a plan view of a CMOS gate array base cell according to the invention.

FIG. 10b illustrates a schematic drawing of the 2 input NAND gate illustrated in FIG. 10a.

FIG. 11 illustrates in detail a plan view of the power and ground buses relative the metal/contact/via region for the 2 input NAND gate macro of FIG. 10a.

FIG. 12 illustrates a plan view of the contacts used for the 2 input NAND gate macro of FIG. 10a.

DETAILED DESCRIPTION OF THE INVENTION

Figure 1:
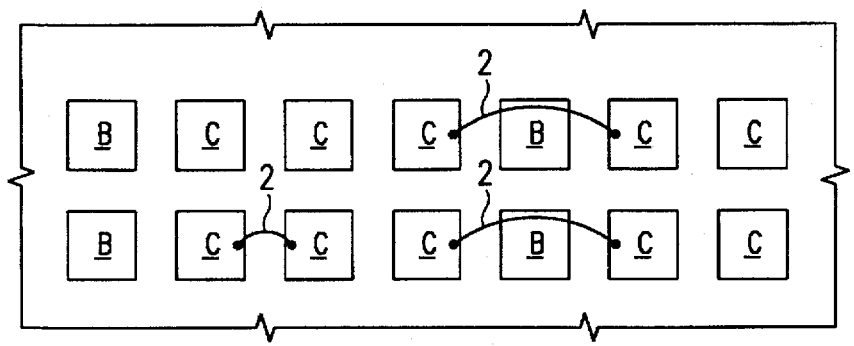
FIG. 1 illustrates a plan view of a representative portion of the tiling of prior art bipolar/complementary metal oxide semiconductor (BiCMOS) base cells.

The invention will be described in conjunction with base cells for BiCMOS and CMOS gate arrays.

FIG. 2a illustrates a plan view of a BiCMOS gate array base cell which allows high bipolar site utilization (HBU). This base cell includes 2 sets of 2 small CMOS sites (each site being labeled CS) with each set being interposed adjacently between 2 large CMOS sites (each site being labeled CL). It will be apparent to those skilled in the art that the ratio of CS sites to CL sites may be altered as desired. The CMOS sites comprise circuitry including CMOS transistors. The 1 to 1 ratio, in the preferred embodiment, of CL sites to CS sites in each base cell allows higher operational speed and increased density. Higher operational speed is due to the decreased loading, in comparison with conventional gate array base cells. The decreased loading results from a reduced input capacitance inherent in the tiling pattern. Bipolar sites (each site comprising circuitry including bipolar transistors and being labeled BN) abut the 2 sets of CS sites and their adjacent CL sites.

The large CMOS sites, CL, can generally be distinguished from the small CMOS sites, CS, in that the large CMOS site, CL, contains transistors having a gate width wider than the gate width of transistors in a small CMOS site. The wider the gate width, the more drive capability a transistor possesses since the wider gate width transistor can source more current than a similarly situated narrower gate width transistor. Thus, the CL sites may be used for both logic and/or drive circuitry. The CS transistors allow reduced input gate loading and increased density in comparison with that associated with a larger transistor. However, in order to take advantage of the reduced input gate loading and increased density, the drive of the individual CS site transistors is less than the drive of the CL site transistors.

In the preferred embodiment, the gate width of CS site transistors is approximately ½ the width of CL site transistors. After taking into account width reduction during processing, the width of a CS site transistor should preferably be within 5% of one half the width of the CL site transistors. An advantage of this is that the CS site can be configured to be the electrical equivalent of a CL site by connecting up CS site transistors in parallel fashion when more CL sites are required by a specific circuit design than are available or for routing flexibility. Accordingly, both the CL and CS sites may be used for logic and/or drive circuitry.

Bipolar transistors are used preferably when large load and speed are needed. The invention's base cell preferably has a bipolar/CMOS site ratio of 1 to 4, although other ratios may be used depending on utilization. Connection symbol 2 illustrates the connectivity of the base cell of the invention. Connectivity via routing on the base cell is possible laterally between adjacent CMOS sites on the same side of a bipolar site BN, either between large CMOS sites CLs (connectivity is not illustrated for this example); between small CMOS sites CSs; or between a small CMOS site, CS, and a large CMOS site, CL. Connectivity via routing is also possible longitudinally between a bipolar site, BN, and a large CMOS site, CL; and between a bipolar site, BN, and a small CMOS site, CS. The base cell of the invention dispenses with the need to cover bipolar sites with metal patterns when creating a macro involving CMOS sites spaced laterally apart. The tiling of the bipolar sites in the manner noted allows for longitudinal connection of bipolar sites to CMOS sites such that the bipolar site has an opportunity to be used with CMOS tiling either above or below. Thus, high utilization of the bipolar sites can be achieved. Note that the number of bipolar sites required per base cell has been reduced from prior art designs. Conventional cells generally find one bipolar site per 3 sites in a base cell with significant under-utilization of the bipolar sites. The invention's base cell provides one bipolar site per 5 sites in a base cell.

FIG. 2b illustrates a plan view of a CMOS gate array base cell which allows reduced loading in comparison with conventional gate array base cells. As shown, this base cell comprises only CMOS sites. The tiling of such sites is such that a large CMOS site CL abuts a small CMOS site CS as shown in FIG. 2b. Like the cell tiling shown in FIG. 2a for the BiCMOS gate array, this large to small gate width pattern as between CL and CS sites allows increased gate array operation speed, due to the decreased loading, in comparison with conventional gate array base cells. The decreased loading results from a reduced input capacitance inherent in the tiling pattern. Connectivities between sites are mostly lateral as shown by connection symbol 2.

Figure 2C:
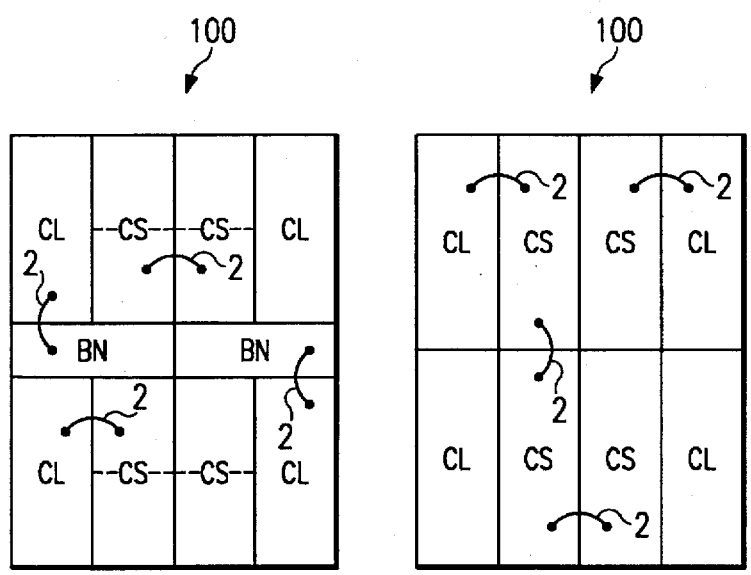
FIG. 2c illustrates a plan view of a gate array according to the invention.
Figure 2C:
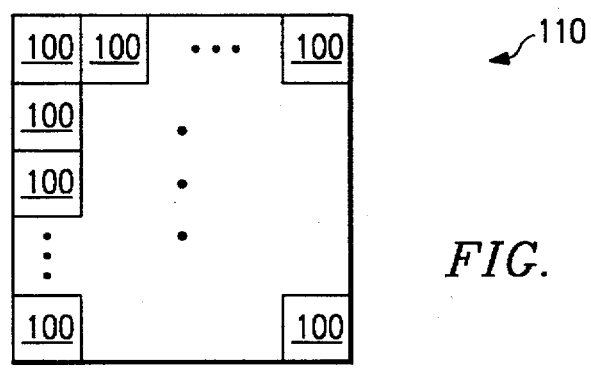

Many base cells 100 such as that shown in FIGS. 2a and 2b are combined in an array of rows and columns to form a gate array 110 as shown in FIG. 2c. Each base cell in a gate array contains unconnected transistors so that individual base cells may be configured differently to create a desired logic circuit. The metallization patterns used to configure a base cell are called macros. Different macros are applied to the base cells to create an ASIC according to individual customer specifications.

Figure 3A:
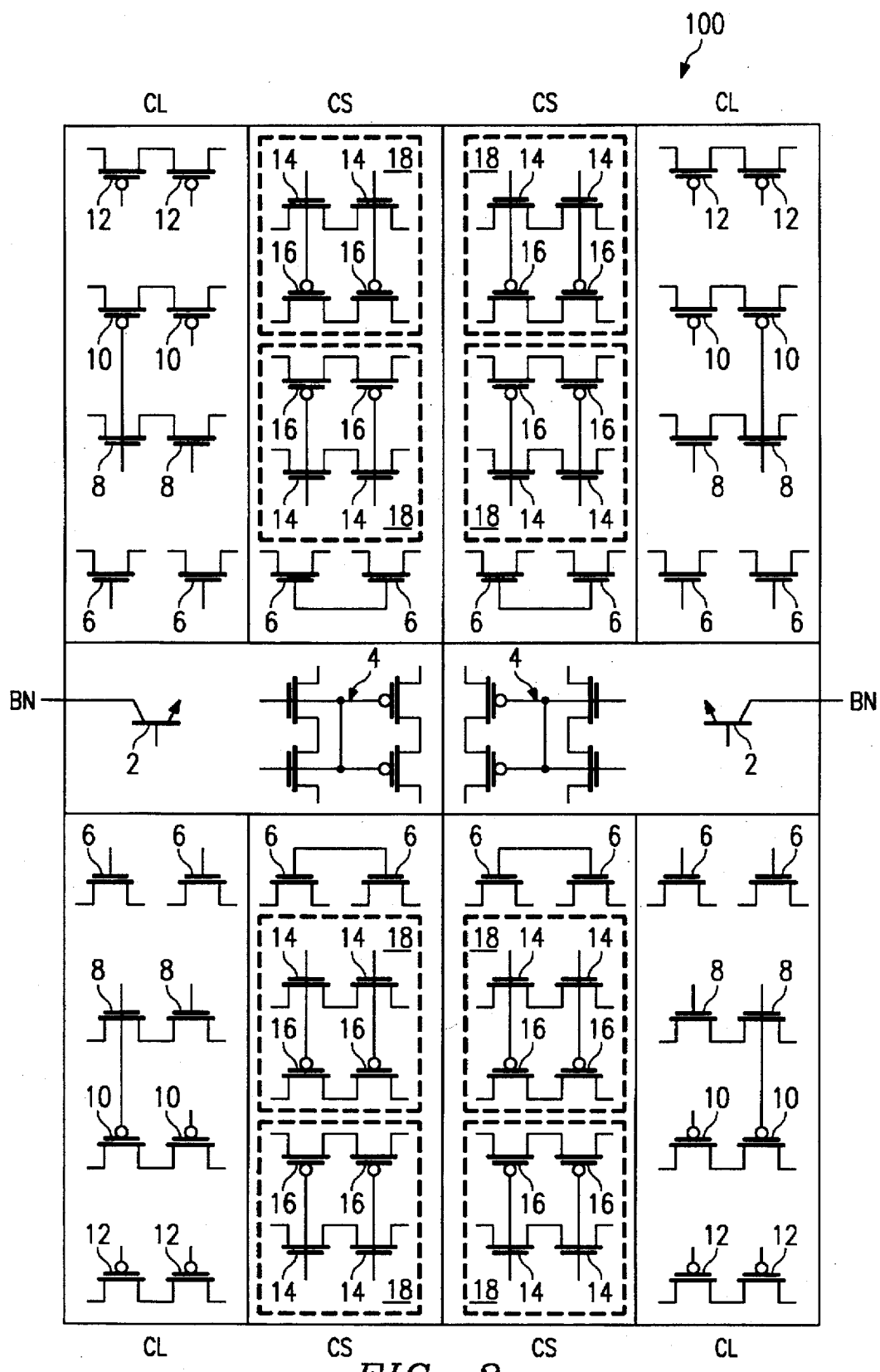
FIG. 3a illustrates a schematic diagram of a base cell according to the invention.

A schematic of a BiCMOS gate array base cell according to a preferred embodiment of the invention is shown in FIG. 3a. A corresponding plan view is shown in FIG. 3b and a plan view of a CMOS base cell according to a preferred embodiment is shown in FIG. 3c.

Figure 3B:
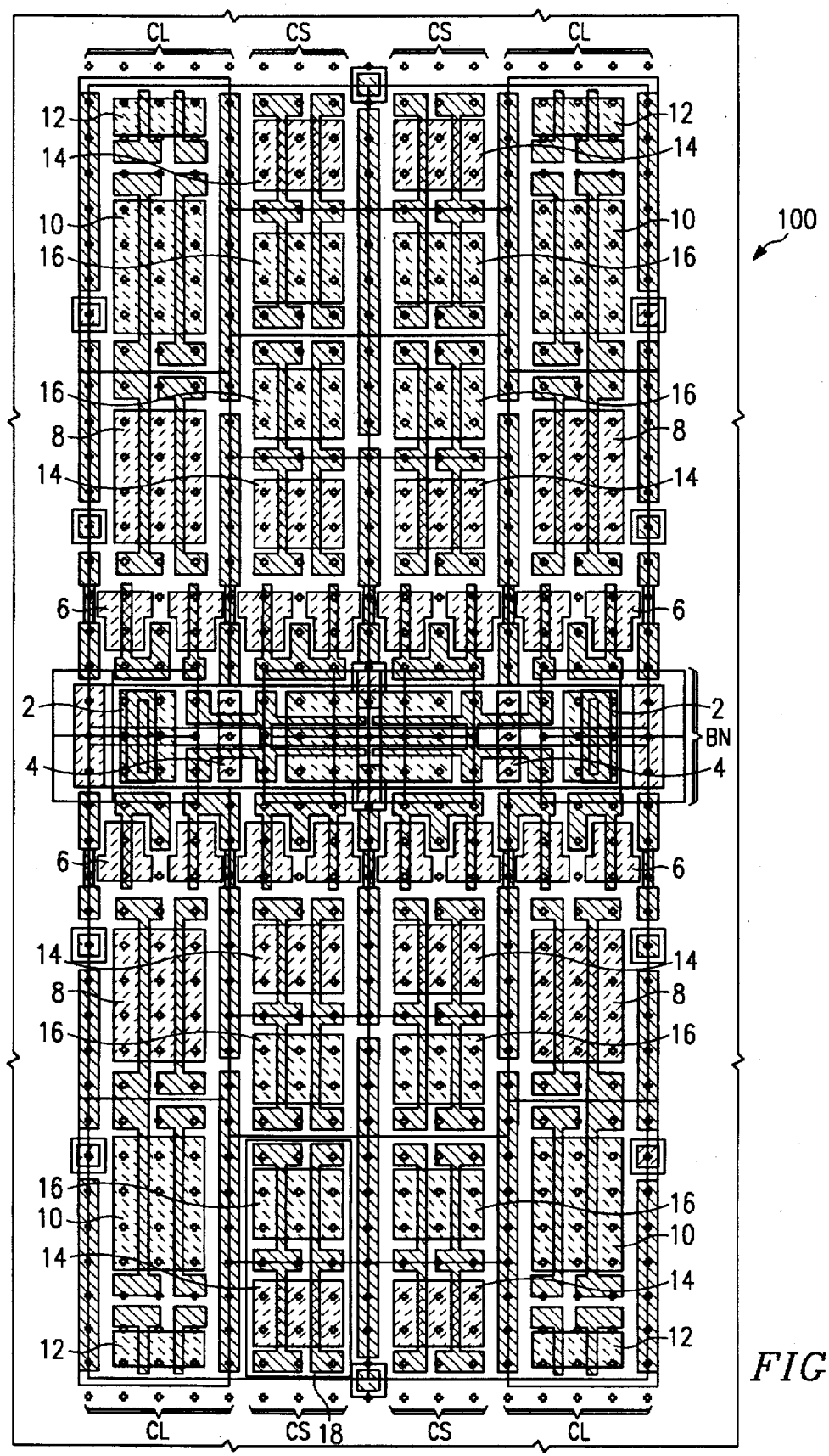
FIG. 3b illustrates a plan view of a BiCMOS base cell according to the invention.
Figure 3C:
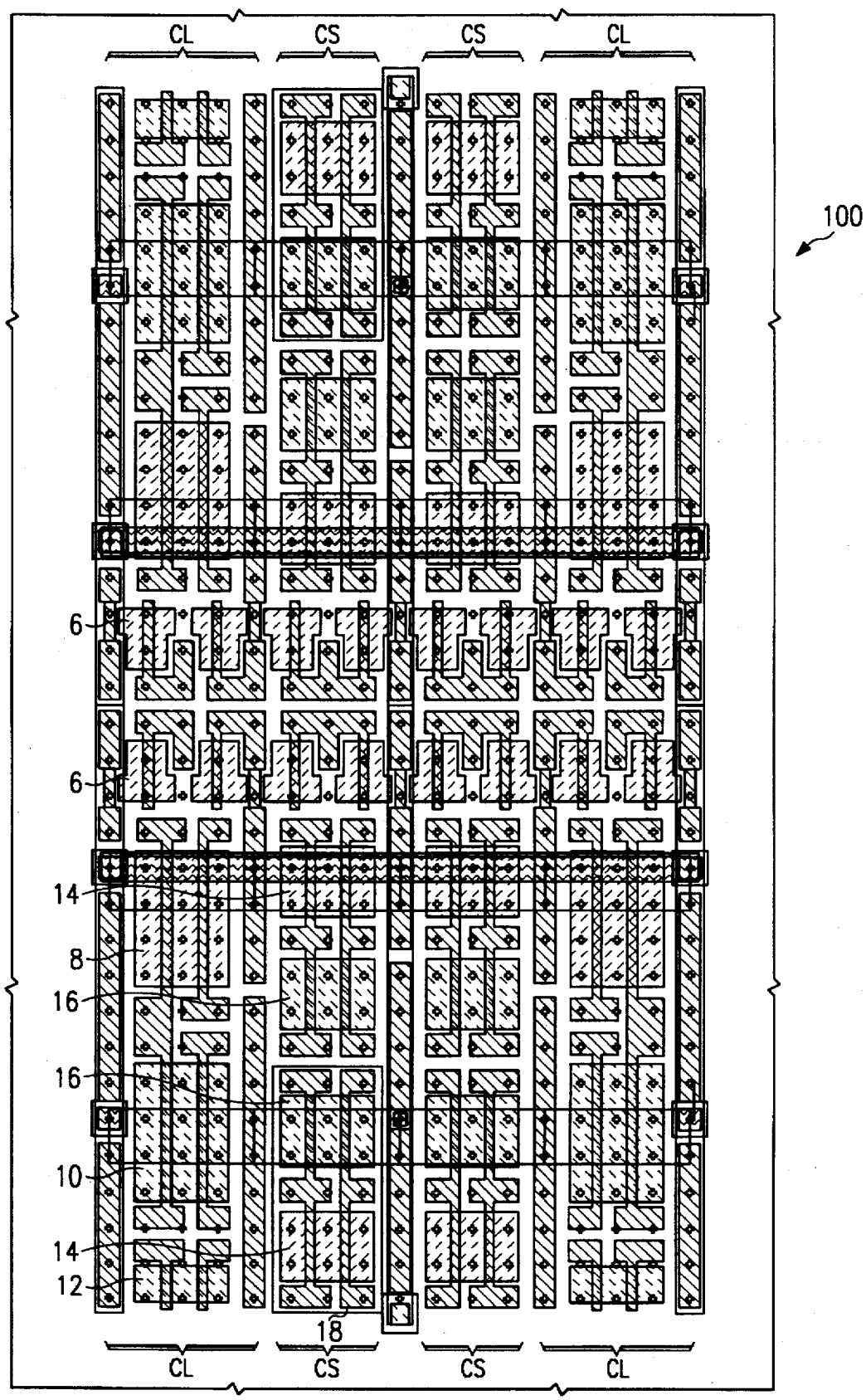
FIG. 3c illustrates a plan view of a CMOS base cell according to the invention.

Referring to FIGS. 3a–b, the CL and CS sites located above the BN sites are inverted from the CL and CS sites located below the BN sites. Each bipolar site BN comprises a bipolar transistor 2 and an inverter 4. Bipolar transistor 2 is on the order of 5 µm×0.06 µm and is located at an outside edge of a BN site. Bipolar transistor 2 shares a common collector with a BN site of an adjacent base cell. The n-channel transistors of inverter 4 each have a gate width on the order of 1.6 µm for a total of 3.2 µm and p-channel transistors of inverter 4 each have a gate width on the order of 4.8 µm for a total of 9.6 µm. Inverter 4 is located at an inside edge of each BN site and shares a common n-well with the adjacent BN site.

Each CL site comprises a pair of pass transistors 6, a pair of n-channel transistors 8, a pair of p-channel transistors 10 and a pair of small p-channel transistors 12. Pass transistors 6 are typically used as pass gates in an SRAM. However, as will be apparent to those skilled in the art, they may be connected to form other functions such as to form logic gates. In the preferred embodiment, the size of pass transistors 6 is on the order of 3.9 µm. Pass transistors 6 are located at an end of a CL site nearest the BN site. Transistors 8 and 10 are typically used in combination to form a CMOS logic gate or drive circuitry. Transistors 8 and 10 each have a size on the order of 9.0 µm. Transistors 8 and 10 are located in the middle of a CL site, with n-channel transistors 8 being located between pass transistors 6 and p-channel transistors 10. Transistors 12 are typically used for logic functions and have a size on the order of 2.4 µm. Transistors 12 are located adjacent p-channel transistors 10 and at an end of a CL site opposite pass transistors 6.

Each CS site comprises a pair of pass transistors 6, two pairs of n-channel transistors 14, and two pairs of p-channel transistors 16. Pass transistors 6 are located at an end of the CS site nearest the BN site as they are in the CL site. Transistors 14 and 16 are matched as closely as possible to one half the size of transistors 8 and 10. In the preferred embodiment, transistors 14 and 16 are each on the order of 4.6 µm.

One pair of transistors 14 and one pair of transistors 16 make up a section 18. Each CS site has two identical (both schematically and layout wise) sections 18. Identical layout is desired to match parasitics between the two sections 18. For that reason and for area savings, the pairs of p-channel transistors 16 are located between the pairs of n-channel transistors 14 in each CS site. Because each CS site has two identical sections 18 and each section 18 contains transistors having a width ½ of that of transistors 8 and 10 (taking into account width reductions of 0.2 µm that occur during processing), the two sections 18 may be connected in parallel to provide an electrical equivalent of transistors 8 and 10 in a CL site. Thus, for routing flexibility and/or additional increased drive sections, as many CS sites as necessary may be converted to electrically equivalent CL sites (equivalent except for transistors 12).

A plan view of a preferred embodiment CMOS base cell is shown in FIG. 3c. A schematic for the CMOS base cell is identical to that of the BiCMOS base cell shown in FIG. 3a except that the BN site is removed. Each CS and CL section of the CMOS base cell is identical to each CS and CL section in the BiCMOS base cell. Since the CMOS sites (CL and CS) in the BiCMOS base cell (FIG. 3b.) have exactly the same patterns as the CMOS sites (CL and CS) in the CMOS base cell (FIG. 3c.), the CMOS macros (or metallization pattern) for the CMOS base cell can be used without any modifications in the BiCMOS base cell. This is also due to the layout of the bipolar BN site being sandwiched between the CMOS sites (CL and CS) in the BiCMOS base cell. The CMOS library can be shared between BiCMOS gate arrays and CMOS gate arrays. This approach of common base cell designs for BiCMOS and CMOS gate arrays promotes synergy between these two technologies, hence reducing effort in supporting libraries.

The BiCMOS and CMOS base cells may be formed using conventional process flows with the placement of structures as shown in the partial base cells of FIGS. 4–9b and discussed below. FIGS. 4–9b show only one row of CL and CS sites and 2 BN sites of a preferred base cell. It will be apparent to those skilled in the art that the structures in the BN site are eliminated for the CMOS base cell.

Figure 4:
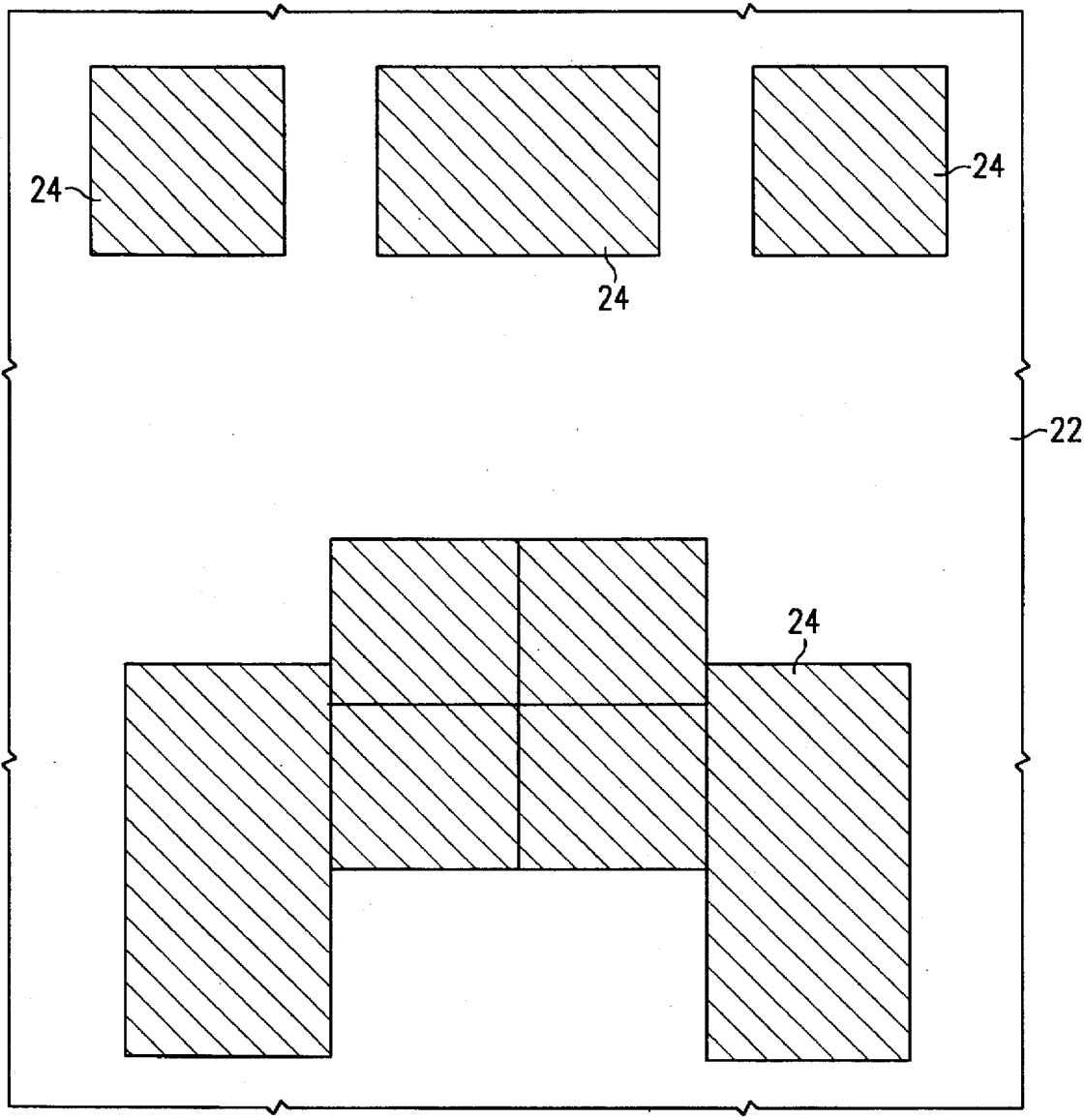
FIGS. 4–9b illustrate plan views of a partial base cell according to the invention at various stages of fabrication.

In order to form a base cell in accordance with the invention, deep well regions 24 are formed in a semiconductor substrate 22 as shown in FIG. 4. Deep well regions 24 may be formed by implantation and diffusion of an n-type dopant such as phosphorous and/or arsenic. The actual plan view shape of deep well region 24 is approximated as a quadrilateral.

Figure 5:
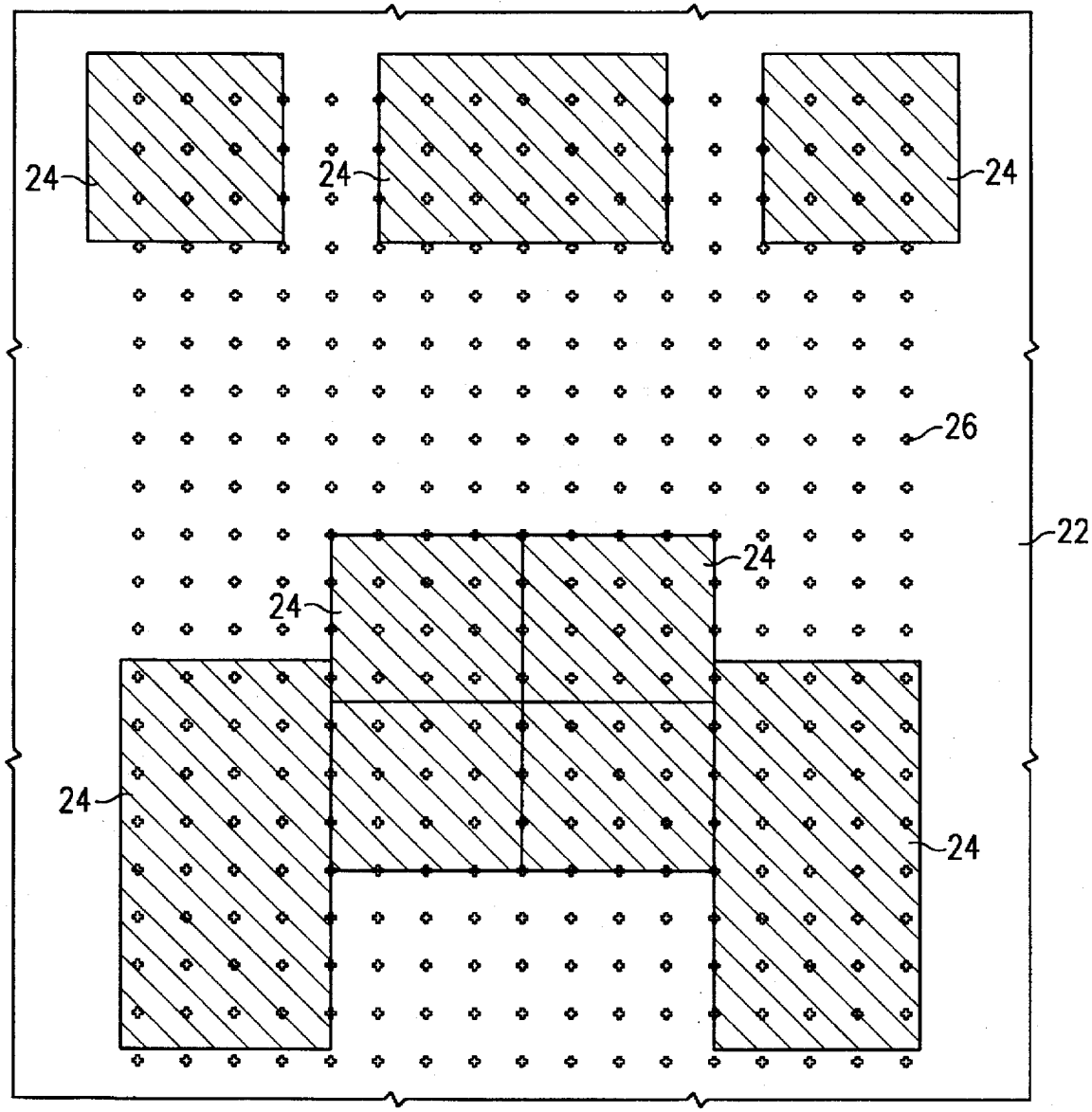

FIG. 5 illustrates a grid point pattern 26 superimposed over the structure of FIG. 4. Grid point pattern 26 is not a physical layer. It is merely used for reference purposes during the design phase so that polycrystalline semiconductor (poly) lines and metallization lines may be laid out and aligned along the grid points of grid point pattern 26. The grid points of grid point pattern 26 are further used as routing grids by an automatic place and route tool to determine an optimum routing for a particular design.

Figure 6:
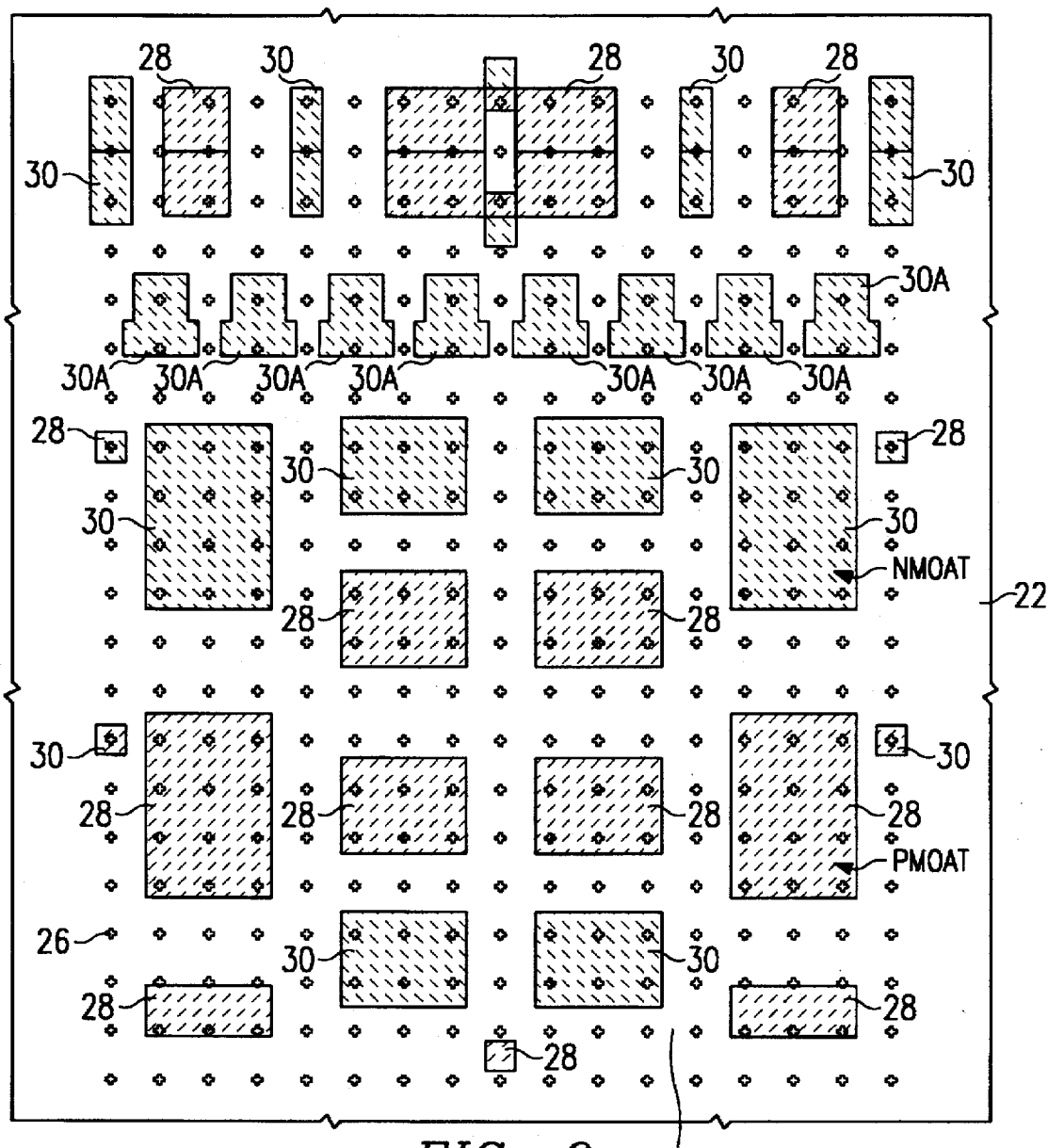

Moat regions PMOAT 28, NMOAT 30 and NMOAT 30A are formed next, as shown in FIG. 6. Note the difference in shading between PMOAT 28 and NMOAT 30. PMOATs 28 are generally formed in deep well regions 24, whereas NMOATs 30 and 30A are generally formed directly in substrate 22. Moat regions 28, 30 and 30A are formed according to conventional techniques. For example, a masking layer (not shown) may be formed to mask the areas where PMOATs 28 and NMOATs 30 and 30A are to be formed. Then, field oxide regions 29 are formed in the exposed areas and the masking layer is removed. Then, p+ and n+ implants may be performed. For ease of illustration, the deep well regions 24 shown in FIG. 5 are not shown in FIGS. 6 and 7.

Figure 7:
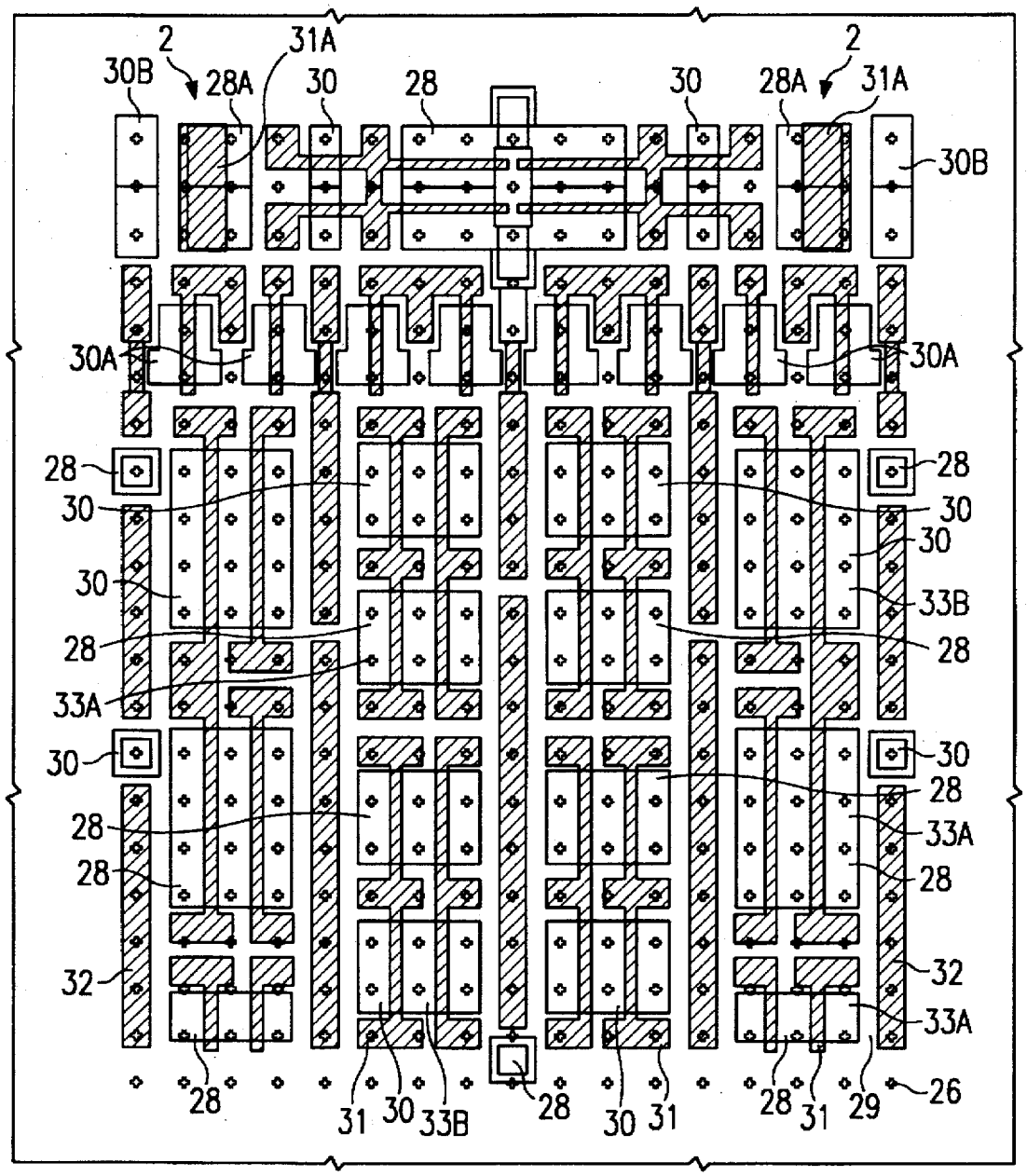

FIG. 7 illustrates a plan view of the location of poly gates 31 and poly jumpers 32 with respect to areas of PMOAT 28 and areas of NMOAT 30. For ease of illustration, poly gates 31 and poly jumpers 32 are shown shaded, yet only several portions are labeled. Poly gates 31 cross over moats 28 and 30. Poly jumpers can be distinguished from poly gates in that the poly jumpers do not cross over moats 28 and 30. Poly gates 31 may be formed by forming a gate oxide layer over the structure and depositing a layer of polysilicon over the gate oxide layer. The polysilicon layer and gate oxide layers are then etched to form poly gates 31. Poly jumpers 32 may be formed simultaneously or by a separate polysilicon deposition and etch.

NMOATS 30A formed adjacent one another (for ease illustrations all are not labeled) may serve as transistor sites for Read/Write SRAM pass gates. The cross-coupled inverters for such an SRAM are built using NMOATS 30 and PMOATS 28. Poly jumpers are used for electrical interconnection on the base cell and are formed on top of field oxide 29 of the base cell. Field oxide 29 is used for isolation between electrically conducting elements of the base cell.

Bipolar transistors 2 are formed according to conventional techniques. Diffused regions 30B are formed to provide contact to a deep well region 24 there below. Deep well regions 24, as shown in FIG. 5, below diffused regions 30B form the collector for bipolar transistor 2. The base region 28A is implanted prior to the formation of emitter electrode 31A. Emitter electrode 31A may be formed prior to or simultaneously with poly gates 31. For example, prior to the deposition of polysilicon described above, the gate oxide layer is etched to leave an emitter contact area above base region 28A. The polysilicon layer is then deposited and etched along with the gate oxide layer to form poly gates 31, poly jumpers 32, and emitter electrode 31A.

Processing then continues with the formation of p+ and n+ source/drain regions 33a and 33b. P+ source/drain regions 33a are formed by the implantation and diffusion of a p-type dopant such as boron and n+ source/drain regions 33b are formed by the implantation and diffusion of a n-type dopant such as phosphorous and/or arsenic. For ease of illustration, only some of the source/drain regions 33a–b are labeled.

Figure 8:
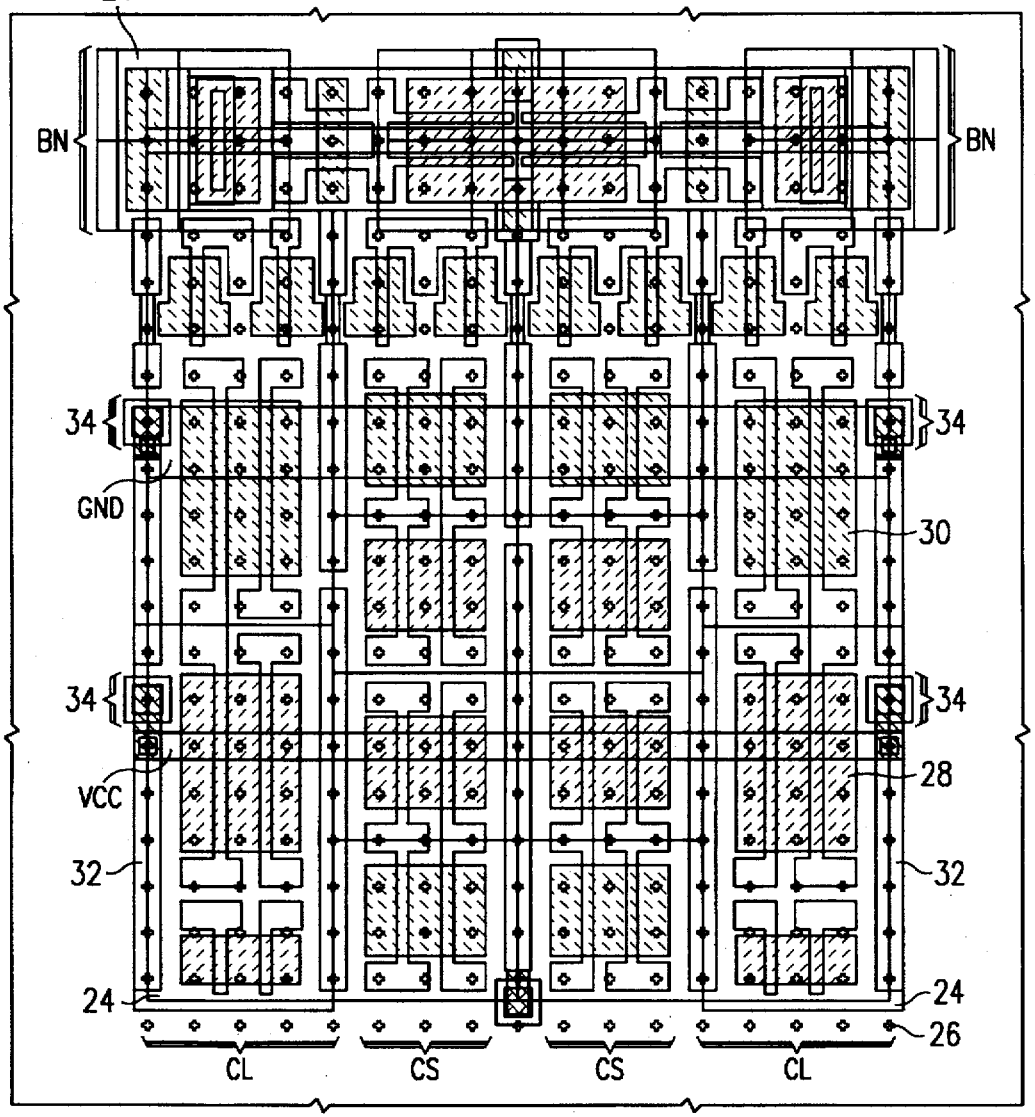

FIG. 8 illustrates a plan view of a partial base cell showing relative locations of large and small CMOS sites (labeled CL and CS, respectively) on the base cell relative to bipolar sites BN and other related base cell circuit elements. Base cell elements are shown in FIG. 8 as superimposed over one another. For ease of illustration, PMOAT 28 and NMOAT 30 are shown shaded and poly gates and jumpers 32 are not shaded. Further, for ease of illustration all elements are not labeled, but retain the same relative positions as indicated on previously discussed drawing figures. The pattern of n-wells 24 underlie all superimposed element representations on the shapes illustrated in FIG. 5. Ground, GND, and power buses, VCC, are shown and preferably represent a top metal interconnect layer. The formation of metal interconnect layers involves successive interlevel dielectric depositions, contact/via formations, and metal deposition and etch to form desired interconnects. The metal/contact/via regions of interconnect are represented by numeral 34.

Figure 9A:
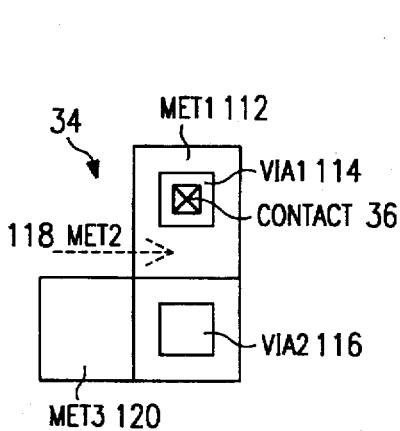
Figure 9B:
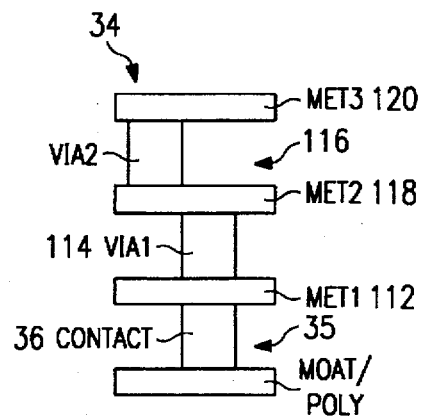

FIGS. 9a and 9b illustrate a plan view and a cross-sectional view, respectively, which details metal/contact/via region 34 of FIG. 8. Regions 34 are formed by conventional techniques. For example, an interlevel dielectric layer 35 may be deposited over the structure. A CONTACT 36 extending through the interlevel dielectric layer 35 to a poly gate 31 or moat region 28, 30 is then formed at desired places. A metal layer MET1 112 is deposited, patterned, and etched. A second interlevel dielectric is deposited and via VIA1 114 is formed through the second interlevel dielectric latter to MET1 112. A second metal layer MET2 118 is deposited patterned and etched. The process continues for the desired number of interconnect levels. Three metal interconnect levels are shown in FIGS. 9a and 9b.

Although GND and VCC are shown in FIG. 8, GND and VCC are preferably formed in the top metal interconnect layer. Accordingly, the desired interconnections (i.e., macros) between transistors in the base cell and between base cells are formed prior to the GND and VCC metal interconnect lines. By using the top metal interconnect for VCC and GND, the VCC and GND metal lines that span the entire gate array will not block macro interconnections to the base cell.

It will be apparent to those skilled in the art that alternate and/or additional process steps may be performed as is well known in the art. For example, lightly doped drains may be formed prior to the formation of poly gates 31 and/or poly gates 31 and source/drains regions 33a–b may be silicided according to conventional techniques.

The application of various macros to the partial base cell of FIG. 8 will now be discussed with reference to FIGS. 10a–21. The macros discussed below represent only a few of the many macros possible. Many other macros will be apparent to those skilled in the art having reference to the specification.

Figure 10B:
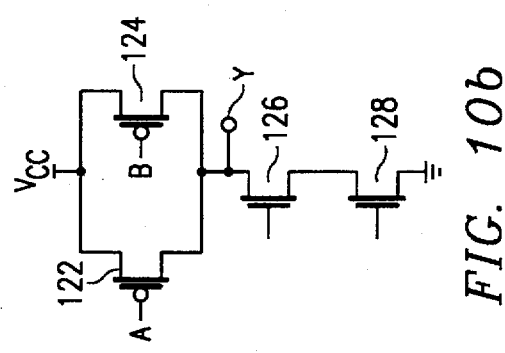
Figure 10A:
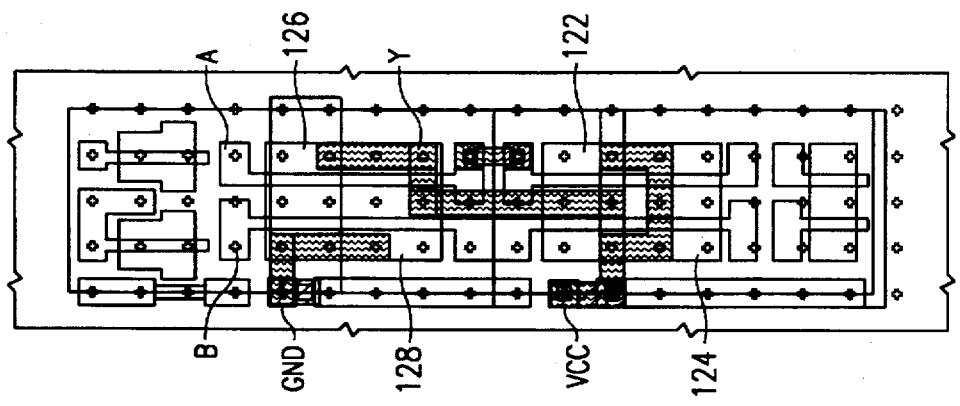
FIG. 10a illustrates a plan view of a 2 input NAND gate macro which can be implemented on the base cell shown in FIG. 8.

A 2 input NAND gate macro will now be discussed with reference to FIGS. 10a–12. FIGS. 10a and 10b illustrate a plan view and schematic drawing, respectively, of a 2 input NAND gate macro which can be implemented on the base cell shown in FIG. 8. Metallization interconnects for the macro are shown shaded in FIG. 10a.

With reference to FIGS. 10a and 10b, the two inputs for the NAND gate are labeled A and B. The output for the NAND gate is labeled Y. The power bus supply voltage, Vcc is labeled VCC and the circuit ground bus is labeled GND. The NAND gate comprises two p-channel transistors 112, 124 connected in parallel and two n-channel transistors 126, 128 connected in series. Each input (A,B) is connected to one p-channel transistor and one n-channel transistor. The output, Y, is the connection point between the p-channel and n-channel transistors. In operation, the output Y will be coupled to GND only when both A and B are logic "high" signals. Otherwise, Y will be coupled to VCC.

Figure 11:
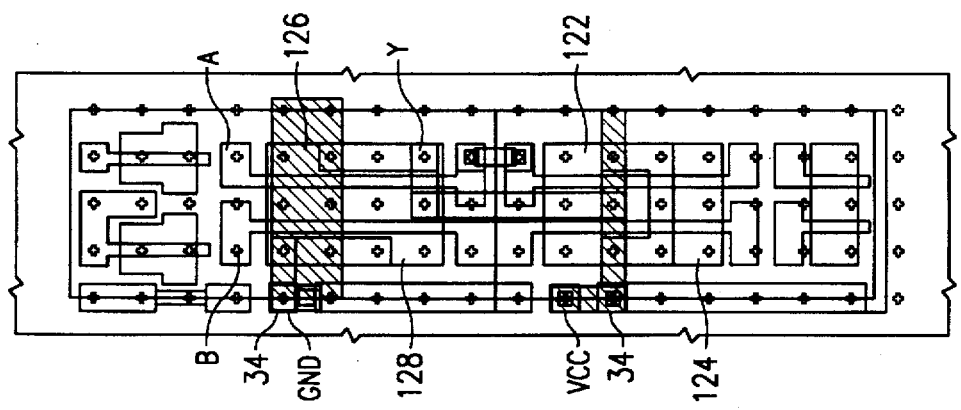

FIG. 11 illustrates in detail a plan view of the power and ground buses relative to metal/contact/via region 34 for the 2 input NAND gate macro of FIG. 10a. For purposes of this illustration only, the power and ground buses are shown shaded.

Figure 12:
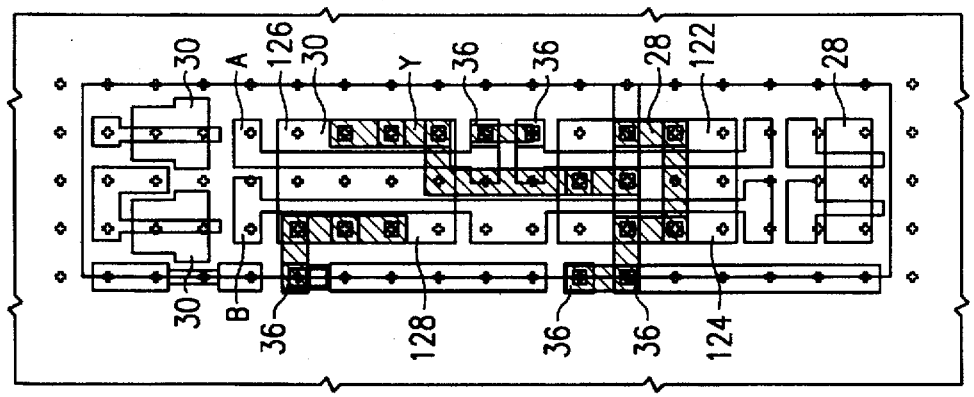

FIG. 12 illustrates a plan view of the contacts 36 used for the 2 input NAND gate macro of FIG. 10a. Contacts 36 connect a metal interconnect layer MET1 to a polysilicon or moat region as shown in FIGS. 9a–b. For ease of illustration, not all contacts 36 are labeled.

A CMOS 2 input exclusive OR gate macro will now be discussed with reference to FIGS. 13–16.

Figure 13:
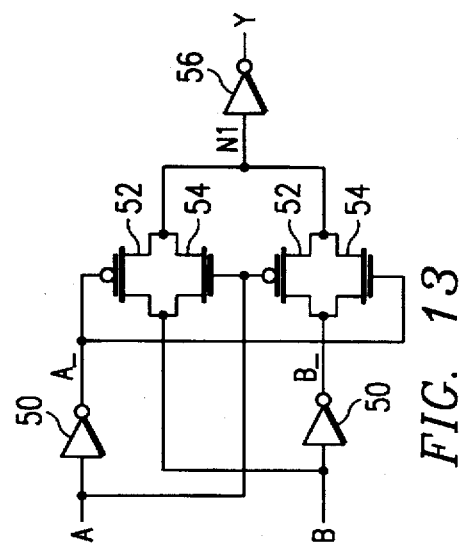
FIG. 13 illustrates a schematic drawing of a CMOS 2 input exclusive OR gate.

FIG. 13 illustrates a schematic drawing of a CMOS 2 input exclusive OR gate. A and B signify true input signals and $\overline{A}$ and $\overline{B}$ signify complement signals. Y indicates the output of the 2 input exclusive OR gate. Input signals A and B are both fed into respective inverters 50 which output respective inverted signals $\overline{A}$ and $\overline{B}$. Signals A, B, $\overline{A}$, and $\overline{B}$ are fed into p-channel transistors 52 and n-channel transistors 54 as shown. A drain/source of transistors 52 and 54 is connected to inverter 56 whose output supplies the output Y of the exclusive OR gate.

Figure 15:
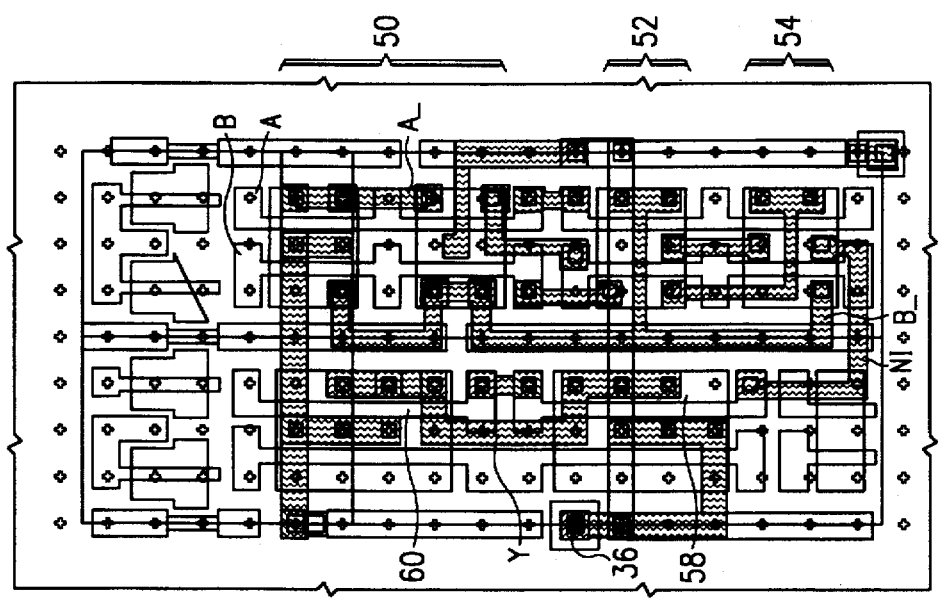
FIG. 15 illustrates a plan view of a macro for the CMOS 2 input exclusive OR gate of FIG. 13 showing poly gates and diffusion areas.
Figure 14:
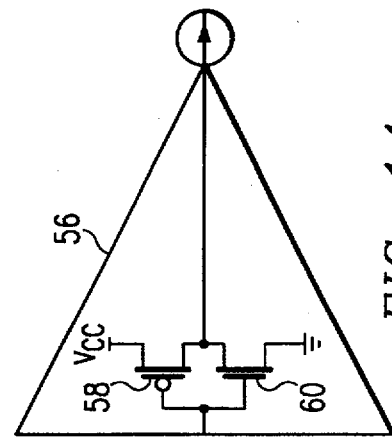
FIG. 14 illustrates a schematic drawing detailing the inverter of FIG. 13.

FIG. 14 illustrates a schematic drawing detailing inverter 56 of FIG. 15. As shown p-channel transistor 58 is connected at its drain to the drain of n-channel transistor 60.

FIG. 15 illustrates a plan view of metallization programmation (showed shaded for purposes of this illustration only) with contacts 36 used in implementing the CMOS 2 input exclusive OR gate macro of FIG. 13.

Figure 16:
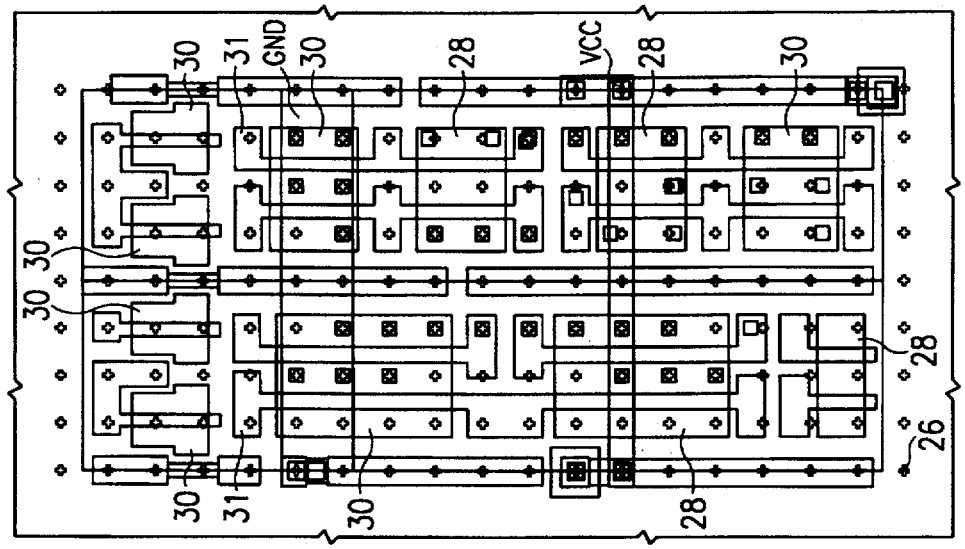
FIG. 16 illustrates a plan view of metallization programmation (showed shaded for purposes of this illustration only) with the contacts used in implementing the CMOS 2 input exclusive OR gate macro of FIG. 15.

FIG. 16 illustrates a plan view of a CMOS 2 input exclusive OR gate macro showing poly gates 31, moats 28 and 30 and GND and VCC metallization.

A BiNMOS 2 input exclusive OR gate macro will now be discussed with reference to FIGS. 17–21.

Figure 17:
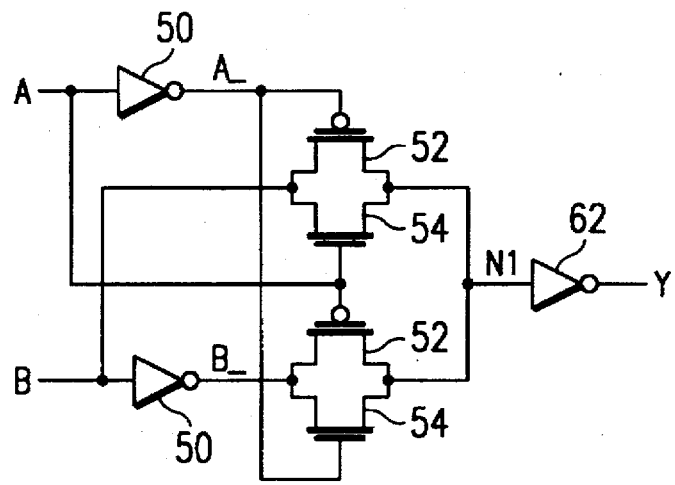
FIG. 17 illustrates a schematic drawing of a 2 input exclusive OR gate implemented using a BiNMOS driver.

FIG. 17 illustrates a schematic drawing of the 2 input exclusive OR gate implemented using a BiNMOS driver. This figure is similar to FIG. 13. However, inverter 62 has been substituted for inverter 56. Inverter 62 includes BiNMOS circuitry, a discussion of which follows.

Figure 18:
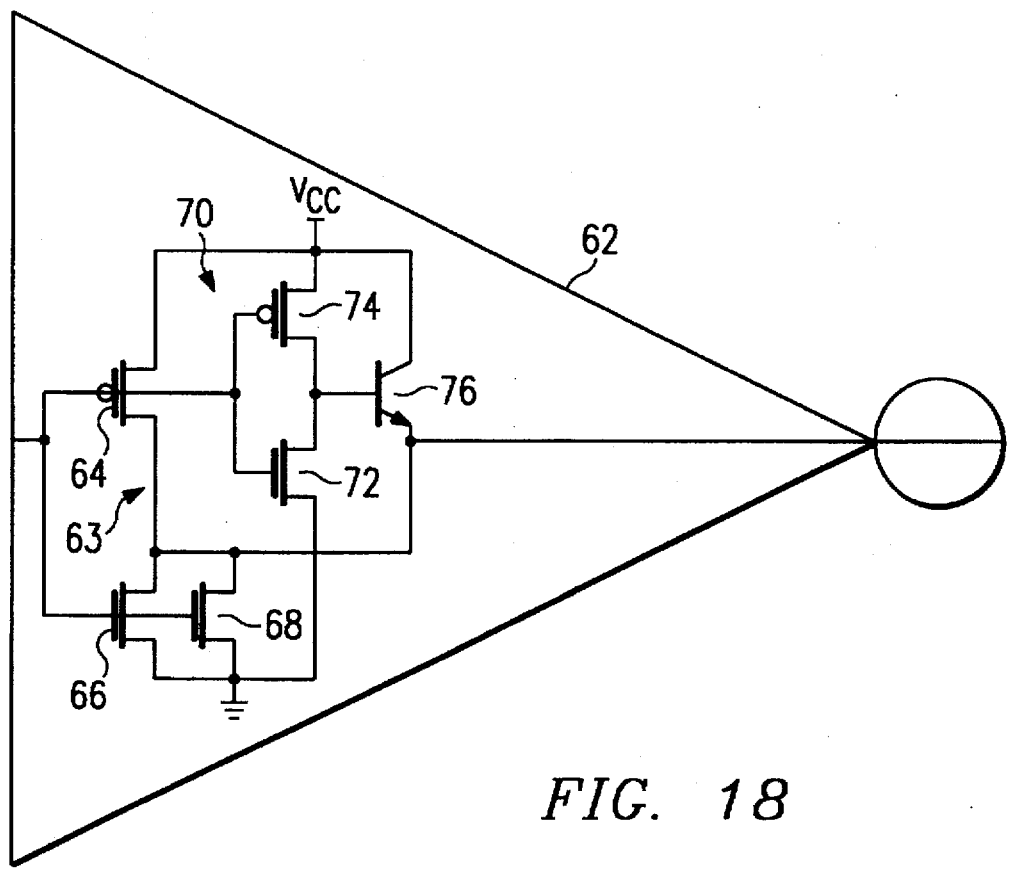
FIG. 18 illustrates a schematic drawing which details a BiNMOS inverter of FIG. 17.

FIG. 18 illustrates a schematic drawing which details inverter 62. Inverter 62 includes inverter 63 comprising p-channel transistor 64 connected to n-channel transistor 66. Each drain/source of transistor 66 is connected to a drain/source of transistor 68. Inverter 62 also includes inverter 70 comprising n-channel transistor 72 connected to p-channel transistor 74. The output of inverter 70 is connected to the base of bipolar transistor 76.

Figure 19:
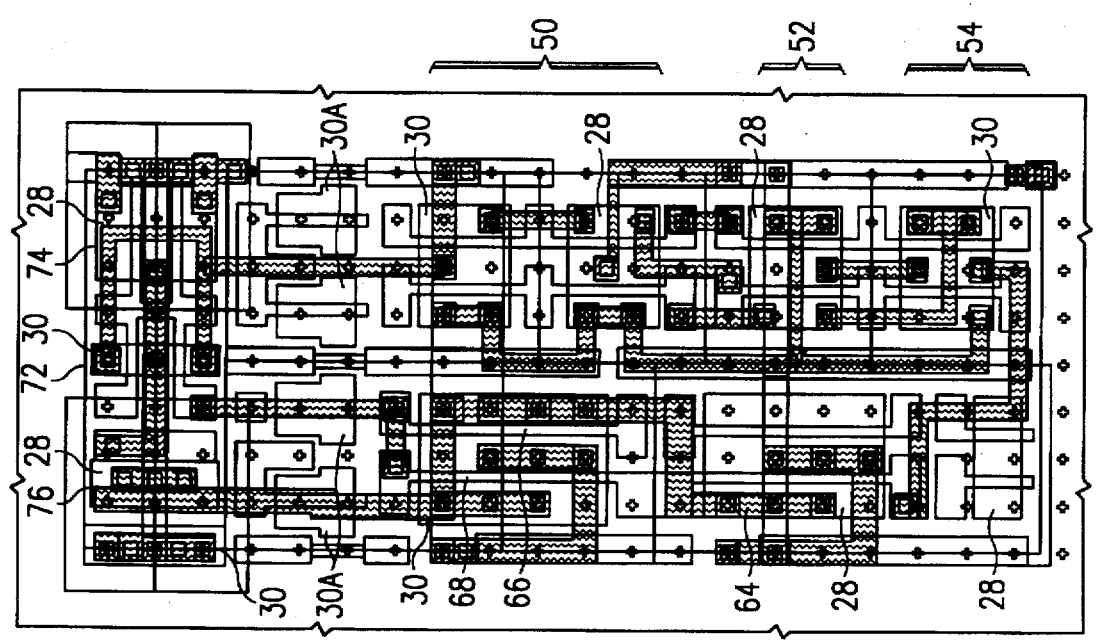
FIG. 19 illustrates a plan view drawing of a 2 input exclusive OR macro used in implementing the 2 input exclusive OR gate of FIG. 17.

FIG. 19 illustrates a plan view drawing of the BiNMOS driver which implements the 2 input exclusive OR macro. In this drawing the metallization pattern of MET1 is superimposed over the moat regions 28 and 30.

Figure 20:
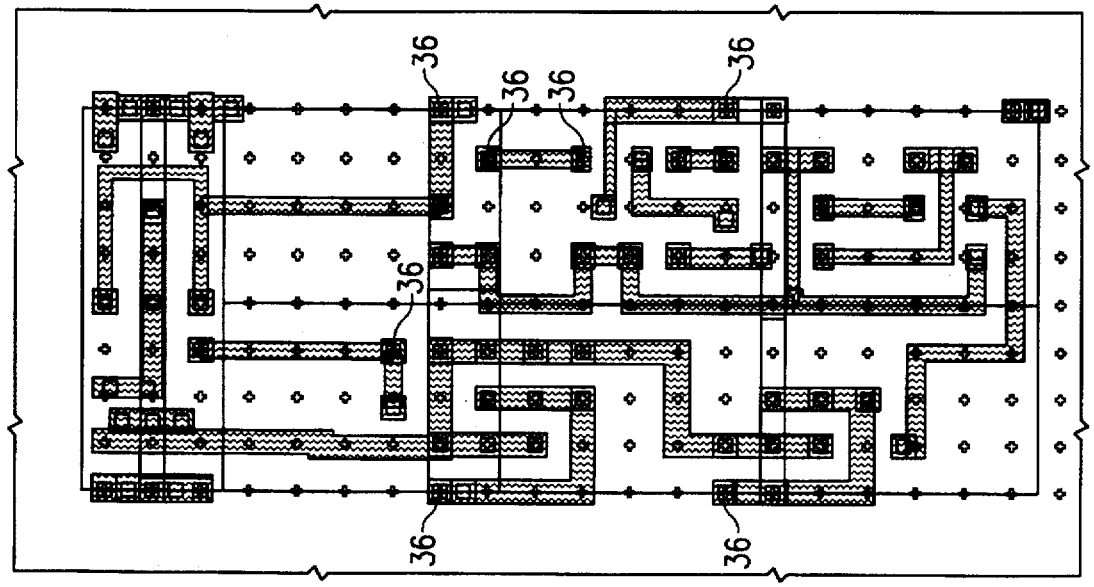
FIG. 20 shows a plan view illustrating power busses used with the BiNMOS driver of FIG. 19 which implements a 2 input exclusive OR macro.

FIG. 20 illustrates a plan view of MET1 (shown shaded) with all contacts for implementation of the BiNMOS driver which implements the 2 input exclusive OR macro.

Figure 21:
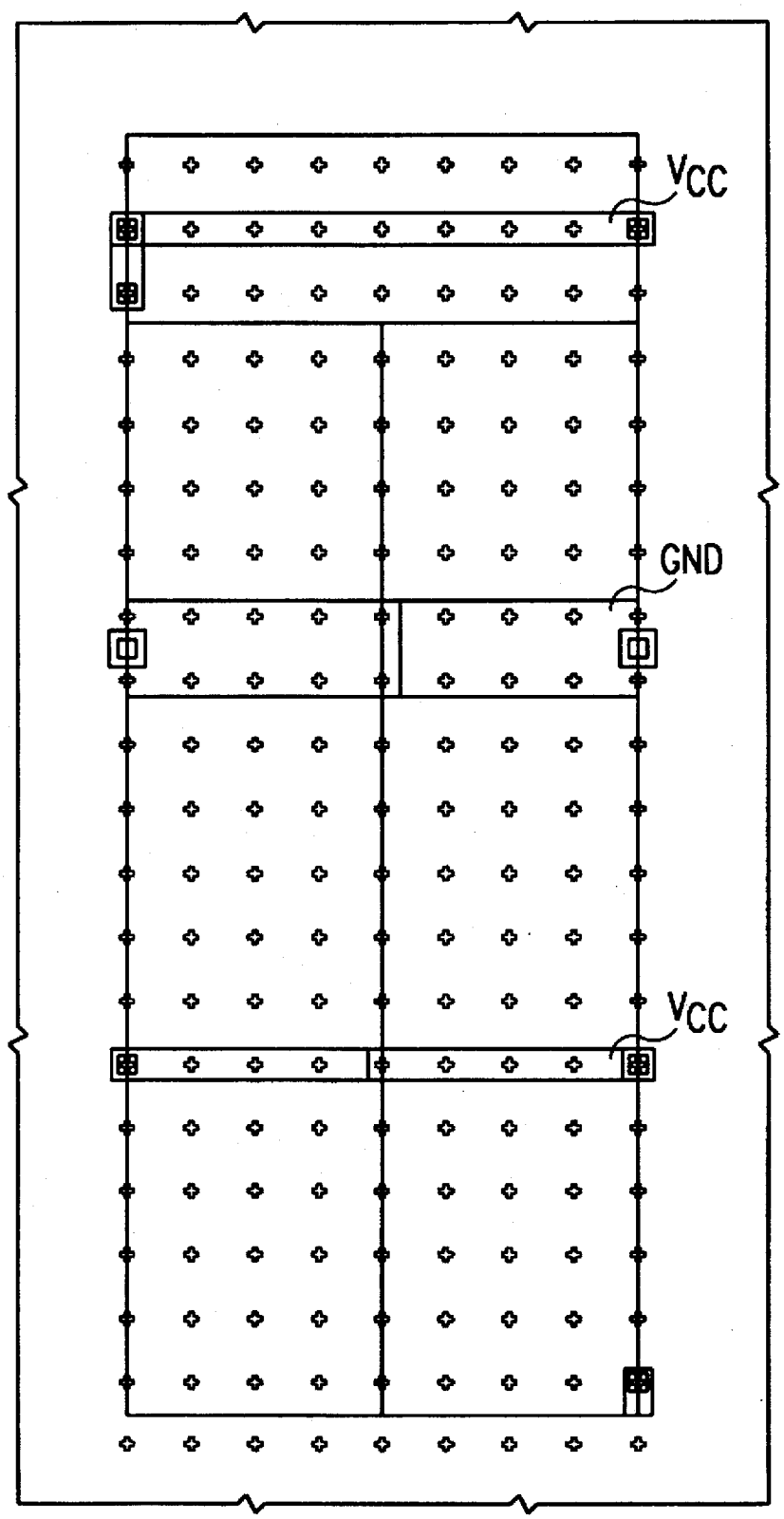
FIG. 21 illustrates a plan view of MET1 (shown shaded) with the contacts for implementation of the BiNMOS driver of FIG. 19 which implements the 2 input exclusive OR macro.

FIG. 21 shows a plan view illustrating power busses used with a BiNMOS driver which implements a 2 input exclusive OR macro. The ground bus is labeled GND and the power bus providing voltage Vcc is labeled VCC.

Although the invention has been described in detail herein with reference to its preferred embodiment and certain described alternatives, it is to be understood that this description is by way of example only, and it is not to be construed in a limiting sense. It is to be further understood that numerous changes in the details of the embodiments of the invention, and additional embodiments of the invention may be made by persons of ordinary skill in the art having reference to this description. It is contemplated that all such changes and additional embodiments are within the spirit and true scope of the invention as claimed below. For instance, a higher density base cell can be constructed by increasing the number of CS sites in the base cell.

I claim:

1. A gate array comprising a plurality of base cells, each of said base cells comprising:

a. a plurality of first CMOS sites, each of said first CMOS sites comprising medium n-channel transistors of a first gate width; and b. a plurality of second CMOS sites each having large n-channel transistors of a second gate width, said second gate width being greater than said first gate width; wherein each of said first CMOS sites and said second CMOS sites further comprise a pair of small n-channel transistors having a third gate width smaller than said first gate width.

2. A base cell for a gate array comprising:

a plurality of large CMOS sites each comprising at least two large n-channel transistors and at least two large p-channel transistors; and a plurality of small CMOS sites each comprising two identical sections, wherein each section comprises at least two medium n-channel transistors having a gate width approximately one half of the gate width of the at least two large n-channel transistors and at least two medium p-channel transistors having a gate width approximately one half of the gate width of said at least two large p-channel transistors.

3. The base cell of claim 2, wherein each of said large CMOS sites and said small CMOS sites comprise a pair of pass transistors.

4. The base cell of claim 2, wherein said plurality of small CMOS sites comprises a number of small CMOS sites equal to a number of large CMOS sites in said plurality of large CMOS sites.

5. The base cell of claim 4, wherein said number is two.

6. The base cell of claim 2, wherein said identical sections are configurable together as the electrical equivalent of said at least two large n-channel transistors and said at least two large p-channel transistors.

* * * * *